(12) United States Patent
Hussain et al.

(10) Patent No.: US 8,641,918 B2
(45) Date of Patent: Feb. 4, 2014

(54) COMPOSITE MATERIAL

(75) Inventors: Shahaid Hussain, Hampshire (GB);
Philip Mark Shryane Roberts, Hampshire (GB); Peter Allen Hobson, Hampshire (GB)

(73) Assignee: Qinetiq Limited (GB)

(*) Notice: Subject to any disclaimer, the term of this patent is extended or adjusted under 35 U.S.C. 154(b) by 652 days.

(21) Appl. No.: 12/673,546

(22) PCT Filed: Aug. 15, 2008

(86) PCT No.: PCT/GB2008/002762
§ 371 (c)(1),
(2), (4) Date: Feb. 15, 2010

(87) PCT Pub. No.: WO2009/024759
PCT Pub. Date: Feb. 26, 2009

(65) Prior Publication Data
US 2011/0186771 A1    Aug. 4, 2011

(30) Foreign Application Priority Data

Aug. 23, 2007 (GB) .................................. 0716442.9
Apr. 17, 2008 (GB) .................................. 0806957.7

(51) Int. Cl.
*H01F 1/20* (2006.01)
*H05K 9/00* (2006.01)

(52) U.S. Cl.
USPC ............... 252/62.54; 252/62.55; 252/62.51 R

(58) Field of Classification Search
USPC .............................. 252/62.54, 62.55, 62.51 R
See application file for complete search history.

(56) References Cited

U.S. PATENT DOCUMENTS 2,954,552 A  * 9/1960 Halpern ........................... 342/1
4,610,808 A  * 9/1986 Kleiner ........................ 252/512

FOREIGN PATENT DOCUMENTS

WO        WO 03/098989    * 11/2003

* cited by examiner

*Primary Examiner* — Carol M Koslow
(74) *Attorney, Agent, or Firm* — McDonnell Boehnen Hulbert & Berghoff LLP

(57) ABSTRACT

A composite material comprises magnetic particles dispersed in electrically insulating material. The magnetic particles have an aspect ratio greater than 1 (preferably greater than 10) and a concentration sufficiently high to produce negative permeability. The magnetic particles may be magnetic flakes of reduced carbonyl iron of average diameter 50 μm, average thickness 1 μm and aspect ratio 50, the magnetic flakes being at least 25% by volume of the composite material. The magnetic flakes may be aligned to produce enhanced permeability. The electrically insulating material may be paraffin wax, particulate PTFE, or another polymer. To control permittivity, the composite material may include an electrically conducting component such as graphite or conductive coatings upon the magnetic flakes.

7 Claims, 4 Drawing Sheets

COMPOSITE MATERIAL

BACKGROUND OF THE INVENTION (1) Field of the Invention

This invention relates to a composite material with negative permeability.

(2) Description of the Art

Conventional materials exhibit positive magnetic permeability p and positive dielectric permittivity ϵ for electromagnetic radiation at microwave frequencies, which corresponds to the radiation in such a material having an electric field E, magnetic field H and wave vector k collectively forming a right-handed triplet of vectors; such materials also exhibit positive refractive index (PRI). Microwave frequencies are those at and above 1 GHz.

Permittivity ϵ and permeability μ are both complex numbers, so they have real (ϵ', μ') and imaginary (ϵ", μ") components. They are given by:

$$\mu = \mu' - i.\mu'', \text{ and} \quad (1)$$

$$\epsilon = \epsilon' - i.\epsilon''. \quad (2)$$

A material has a negative refractive index at a particular frequency of electromagnetic radiation if its permittivity and permeability are both simultaneously negative at that frequency: negative refractive index corresponds to the phase velocity (i.e. wave vector k) being reversed and the radiation's E, H and k vectors forming a left-handed triplet of vectors. Negative permittivity and negative permeability are defined as the real components (ϵ', μ') of these parameters possessing negative values. In negative refractive index materials, radiation refracts in the opposite direction to conventional PRI materials. Such materials are also known as left-handed materials and have been shown to have a number of potentially advantageous properties. Materials with negative permittivity and/or permeability and negative refractive index have a number of applications: e.g. radomes to protect antennas, signal filtering, radiation dissipation at anechoic chamber walls, and radiation shields to comply with regulations laid down by regulatory bodies and prevent electromagnetic interference.

Smith D. R., Pendry J. B., Wiltshire M. C. K., "Metamaterials and Negative Refractive index", Science, 305, 1788, 2004 disclose artificial media (also known as 'Metamaterials') with negative permittivity or permeability, e.g. periodically spaced wires for negative permittivity and split ring resonators for negative permeability.

Composite materials which have negative permittivity or negative permeability are known. A thesis, "Electrical Percolation and the Design of Functional Electromagnetic Materials" by Ian J. Youngs, University of London, England, December 2001, has a discussion of the background to and physics of such materials. Published International Application No. WO 2005/052953 A1 discloses negative permittivity composite materials which consist of electrically conducting particles in an insulating matrix, e.g. nanospheres of silver 15 nm or 100 nm in diameter randomly dispersed in paraffin wax or polytetrafluoroethylene (PTFE) spheres 1 μm or 100 μm in diameter.

U.S. Pat. No. 5,498,644 to N J Reo discloses a composite material for electromagnetic interference shielding, the material comprising electrically conducting, magnetic, silver coated micro-balloons incorporated in a silicone elastomer: there is no disclosure of negative permeability. GB 1224735 to G I Andrews et al. discloses a composite material for self lubricating bearings and comprising metal particles such as iron, steel or cobalt incorporated in a polymer such as PTFE: here again there is no disclosure of negative permeability.

EP 0951023 discloses a magnetic composite comprising flaky magnetic powder in an organic binder. All examples of the composite exhibited positive magnetic permeability of approximately 4 or greater at frequencies up to 1000 MHz (see FIG. 2).

U.S. Pat. No. 6,054,210 relates to a magnetic article comprising oblate spheroidal ferromagnetic particles embedded in a polymer binder. There is no disclosure of negative magnetic permeability.

EP 1661647 discloses a magnetic composite sheet comprising a soft flaky magnetic powder dispersed in chlorinated polyethylene. Negative magnetic permeability is not disclosed.

U.S. Pat. No. 5,925,455 discloses a composite comprising alternating layers of dielectric flakes and magnetic flakes dispersed in a polymer binder. There is no disclosure of negative magnetic permeability.

GB 1299035 discloses a composite comprising a polymer encapsulated combination of magnetic particles and a solid or paste or dye or pigment. From disclosed weight fractions, the magnetic particles are less than 5% by volume of the capsules, and even less of the capsule/polymer dispersion as a whole: this is unsuitable for negative magnetic permeability.

WO 2006/078658 A1 discloses a device incorporating multiple helices and exhibiting negative magnetic permeability: it is similar to conventional artificially engineered negative permeability media. There is no disclosure of a composite material incorporating magnetic particles dispersed in another medium.

Metals contain significant numbers of electronic charges that are free to move through the bulk of the material (the conduction band electrons). An electric field applied to a metal therefore induces a macroscopic electrical transport current in the material.

The frequency response of the permittivity of metals is determined by weakly bound (effectively free) electrons in the conduction band. At low frequencies, the electrons oscillate in phase with an applied electric field. However, at a certain characteristic frequency, oscillation in phase with the applied field can no longer be supported, and resonance occurs. Free electrons in a metal can be considered to be a plasma, i.e. a gas consisting partly or wholly of charged particles. The electron gas may be two dimensional and held between two electrodes. Under an applied electric field the electrons will move in the opposite direction to the field resulting in charges of opposite sign at either end of the plasma. It can be shown that the electrons oscillate at a characteristic frequency $\omega_p$ referred to as the plasma frequency given by $$\omega_p^2 = (e^2/m_e\epsilon_0)N \quad (3)$$

where e and $m_e$ are the electronic charge and mass. $\epsilon_0$ is the permittivity of free space and N is the number of electrons in the plasma.

For metals, $\epsilon_p$ is in the ultraviolet. For frequencies above $\epsilon_p$, metals can be considered to act like dielectrics, i.e. they have a positive permittivity and support a propagating electromagnetic wave.

The oscillation of a plasma may be quantised: a plasmon is the unit of quantisation. The action of plasmons produces a complex dielectric function (or permittivity) $\epsilon(\omega)$ of the form:

$$\varepsilon(\omega) = 1 - \frac{\omega_p^2}{\omega(\omega + i\gamma)} \quad (4)$$

For frequencies below $\omega_p$, metals exhibit a negative permittivity, and electromagnetic radiation cannot propagate but instead decays exponentially.

Unlike metals, dielectrics contain only bound electrons, and become polarised under an applied electric field E. A time varying electric field E(t) of frequency $\omega$ exerts a force on an electron giving rise to an equation of motion for the electron of:

$$m_e \frac{d^2 x}{dt^2} + m_e \gamma \frac{dx}{dt} + m_e \omega_0^2 x - eE_0 \cos\omega t = 0 \quad (5)$$

where e and $m_e$ are the electronic charge and mass, $E_0$ is the electric field magnitude, $\omega_0$ is a characteristic (or resonant) frequency, and x is a distance moved by an electron under the electric field; $m_e y dx/dt$ is a damping term representing the time delay between applying the electric field and establishing polarisation equilibrium. The resulting dielectric polarisation due to N electrons is given by P=exN, which is related to the dielectric permittivity $\epsilon$ by $$\epsilon = \epsilon_0 + P(t)/E(t) \quad (6)$$

Hence the permittivity of the dielectric is given by $$\varepsilon = \varepsilon_0 + \frac{e^2 N}{m_e} \frac{1}{(\omega_0^2 - \omega^2 - i\gamma\omega)} \quad (7)$$

The characteristic frequency $\omega_0$ is indicated by a maximum in the imaginary permittivity and represents radiation absorption from electron-phonon interactions. Over a frequency range containing an absorption band, the real permittivity is frequency dependent Identifying materials with different permittivities can enable the design of components and devices with different electromagnetic functionality (for example, different levels of reflection, transmission and absorption) operating over specific regions of the electromagnetic spectrum. However, the range of naturally occurring permittivities is not adequate for many purposes, which has led to development of composite media with complex permittivity that can be tailored to suit a particular use.

It has been known for some time [Bracewell R. Wireless Engineer, p. 320, 1954] that periodic arrays of metal elements can be used to form composite media (metamaterials) with plasma frequencies lower than that of a conventional bulk metal. More recently, in Phys. Rev. Letters, vol. 76, p. 4773, 1996, Pendry J et al. demonstrated that a periodic lattice of thin metallic wires could exhibit a plasma frequency in the microwave region given by;

$$\omega_p \approx 2\pi c^2/(d^2 \ln(d/r)) \quad (10)$$

Periodic arrangements of metallic elements, such as split ring resonators, are known to exhibit negative magnetic permeability at microwave frequencies: see Pendry J et al., *IEEE Transactions on Microwave Theory and Techniques*, vol. 47, p 2075, 1999. Such arrangements are however difficult and costly to fabricate. Holloway et al, IEEE Transactions on Antennas and Propagation, Vol 51, No. 10, October 2003 have speculated that it may be possible to produce a material with both negative permeability and negative permittivity in a composite material consisting of insulating magneto-dielectric spherical particles embedded in an insulating matrix.

It is desirable to find negative permeability materials in which the magnetic component of the electromagnetic wave will die away exponentially. A composite material with a tailored plasma frequency would also be valuable. The scientific literature has reported that a plasma frequency has been achieved at microwave or radio frequency.

The magnetic properties of materials result from electron motion, which leads to magnetic dipoles within magnetic materials. Under equilibrium conditions, magnetocrystalline anisotropy (an intrinsic property of a material) causes a particle to have a magnetic moment which lies parallel to the particle's magnetic axis (which defines preferred crystalline axes for magnetisation, as dictated by the preferred direction of magnetic dipoles). When a field is applied, the magnetic moment deviates from the magnetic axis and is subjected to a mechanical torque, which causes precession (also known as Larmor precession) about the axis. In 'real' systems, where damping resulting from imperfections is also present, the magnetic moment has a motion described by the following Landau and Lifshitz equation [Landau L. D., Lifshitz E. M., Pitaevskii L. P., "Electrodynamics of Continuous Media", (Butterworth-Heinenann, Oxford, 1998)]:

$$\frac{dm(t)}{dt} = -\mu_0 \gamma_m \left( \Gamma(t) + \frac{\lambda}{m^2} [m(t) \times \Gamma(t)] \right) \quad (11)$$

where $\mu_0$ is the free space permeability, $\gamma_m$ is the gyromagnetic ratio, $\lambda$ is a damping constant and $\Gamma(t)$ is total torque exerted on the magnetic dipole moment, m, by both magnetic anisotropy and external magnetic field.

The rate at which a magnetic moment precesses about an axis is given by the Larmor or Ferromagnetic Resonance Frequency, $f_L$. Permeability spectra exhibit a resonance at this frequency, because energy is absorbed from an incident field in order to overcome damping of the precessional motion: $f_L$ is given by:

$$f_L = \frac{\mu_0 \gamma_m H_A}{2\pi} \quad (12)$$

where $H_A$ represents an anisotropy field associated with the direction of the magnetic moment, m, with respect to crystallographic axes.

SUMMARY OF THE INVENTION

It is an object of the invention to provide a composite material which exhibits negative permeability without requiring periodic arrangements of metallic elements.

The present invention provides a composite material comprising magnetic particles dispersed in electrically insulating material, wherein the magnetic particles have an aspect ratio greater than 1 and are present in the composite material with a concentration sufficient to produce negative permeability at ferromagnetic resonance.

The invention provides the advantage that negative permeability is obtained by a dispersion of magnetic particles in electrically insulating material, which is simpler and cheaper to fabricate compared to periodic arrangements of metallic elements.

The magnetic particles may have an aspect ratio greater than 3, preferably greater than 10. They may be magnetic flakes of carbonyl iron that may have an aspect ratio of greater than 10 with an average longest dimension of 50 μm and an average thickness of 1 μm. Their concentration in the composite material may exceed 25% by volume. They may have respective longest dimensions which are sufficiently well aligned with one another to produce enhanced permeability for a like aligned magnetic field.

The electrically insulating material may be paraffin wax, particulate PTFE or other polymers or resins. The composite material may include an electrically conducting component to provide control over permittivity. The electrically conducting component may be an electrically conducting material such as graphite or it may be conductive coatings upon the magnetic particles.

The composite material of the invention may pervade pores of a percolated material having an excluded volume microstructure which is electrically conducting. The electrically conducting excluded volume microstructure may exhibit negative permittivity and the combination of excluded volume microstructure and the pore pervading composite material may exhibit negative refractive index. The electrically conducting excluded volume microstructure may be an open cell metal or metal alloy foam.

Embodiments of the present invention will now be described, by way of example only, with reference to the accompanying drawings. The drawings are solely to illustrate preferred embodiments of the invention, and are not to be construed as unifying the invention or limiting the invention or limiting any claim herein. One of ordinary skill in the art of composite materials will readily and easily envisage alternative embodiments of the invention in its various aspects. The drawings are as follows:

DESCRIPTION OF THE DRAWINGS

FIGS. 1 and 2 relate to real and imaginary components of permeability respectively and FIGS. 3 and 4 to real and imaginary components of permittivity;

DESCRIPTION OF THE INVENTION

For the purposes of generating the results shown in FIGS. 1 to 4, four composite materials were produced which consisted of different volume percentages of magnetic flakes dispersed in paraffin wax, i.e. materials with 15 vol %, 25 vol %, 35 vol % and 50 vol % magnetic flakes respectively. For each composite material, appropriate quantities of its filler component material and paraffin wax host matrix were measured into containers. The filler was then dispersed in molten paraffin wax and stirred until solidification. The resulting composite was then die-pressed at room temperature at a pressure of 100 MPa for 30 seconds to produce a coaxial composite material for testing.

The magnetic flakes in the composite materials were reduced carbonyl iron flakes for which the website of the manufacturer (Eckart) quotes an average diameter of ~50 μm and a thickness of ~1 μm. Other magnetic flakes of different materials may also be used, although the frequency at which negative permeability occurs may change due to different magnetic properties (e.g. ferromagnetic resonance frequency). In this specification the expression "flake" is to be construed as a largely two dimensional platelet, i.e. a platelet with a high aspect ratio: here aspect ratio for a flake is defined as diameter divided by thickness and a high aspect ratio is one which is greater than 10. A sphere has an aspect ratio of 1. For this invention the aspect ratio of magnetic particles in the composite material such as magnetic flakes is greater than 1 and should preferably be at least 3, e.g. 10 or more. The magnetic flakes in the composite materials produced as aforesaid had an aspect ratio equal to 50. Other high aspect ratio magnetic materials may also be used either instead of or mixed with magnetic flakes, e.g. magnetic needle shaped particles or crystals which are largely one dimensional: for such needle shaped material the aspect ratio is the ratio of length to cross-sectional diameter or thickness. More generally aspect ratio for magnetic particles in the composite material may be defined as longest particle dimension divided by shortest particle dimension.

Although the four composite materials employed a host matrix of paraffin wax, other host matrices may be used such as polytetrafluoroethylene (PTFE) spheres 1 μm or 100 μm in diameter: the only criterion for the host matrix is that it be electrically insulating. Suitable electrically insulating host matrix materials are disclosed in e.g. published International Application No. WO 2005/052953 A1.

Figure 1:
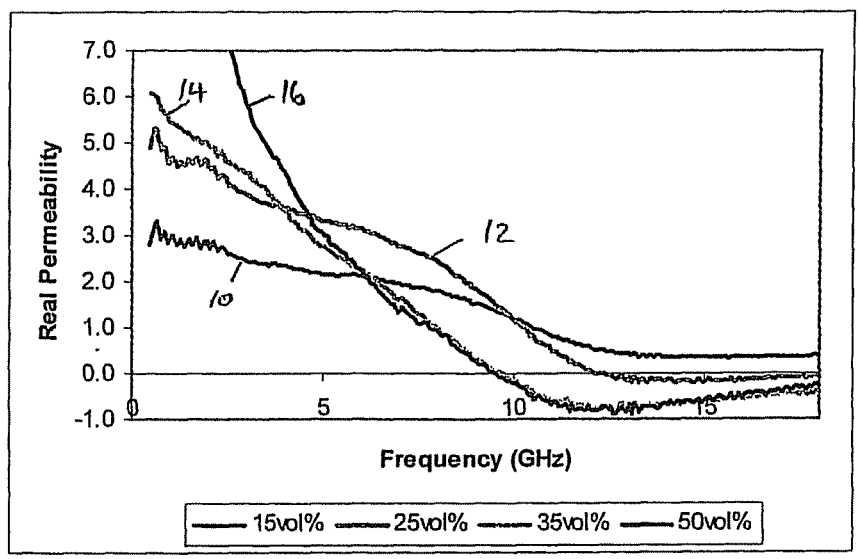
FIGS. 1 to 4 all provide graphs of permeability or permittivity components against microwave frequency for each of four composite materials comprising different volume percentages of magnetic flakes dispersed in paraffin wax.

Real components of permeability plotted against microwave frequency in the range 0.5 to 18 GHz are shown in FIG. 1 for the four composite materials produced as described above: in this drawing, curves 10, 12, 14 and 16 relate respectively to 15% by volume (vol %), 25 vol %, 35 vol % and 50 vol % magnetic flakes dispersed in paraffin wax. Curve 10 (15 vol %) shows an all positive real component of permeability varying between 3 and 0.5. Curve 12 (25 vol %) shows a real component of permeability falling from an positive value of 5 at 0.5 GHz to zero at 12.5 GHz and than to a negative value of 0.2 at microwave frequencies between 14 GHz and 15 GHz where ferromagnetic resonance (FMR) occurs. Curve 14 (35 vol %) shows a real component of permeability falling from an positive value of 6 at 0.5 GHz to zero at 12.5 GHz and then to a negative value of 0.8 at FMR between 12 GHz and 13.5 GHz. Curve 16 (50 vol %) shows a real component of permeability falling from an positive value of 7 at 2.5 GHz to zero at 9.5 GHz and then having the same values as curve 14 at frequencies above 9.5 GHz, i.e. a negative value of 0.8 at FMR between microwave frequencies of 12 GHz and 13.5 GHz. All values quoted from graphs 10 to 16 are approximate: these graphs therefore show that a negative real component of permeability and FMR are achieved at and above loadings of 25 vol % of carbonyl iron magnetic flakes with average diameter ~50 μm and thickness ~1 μm dispersed in paraffin wax.

Figure 2:
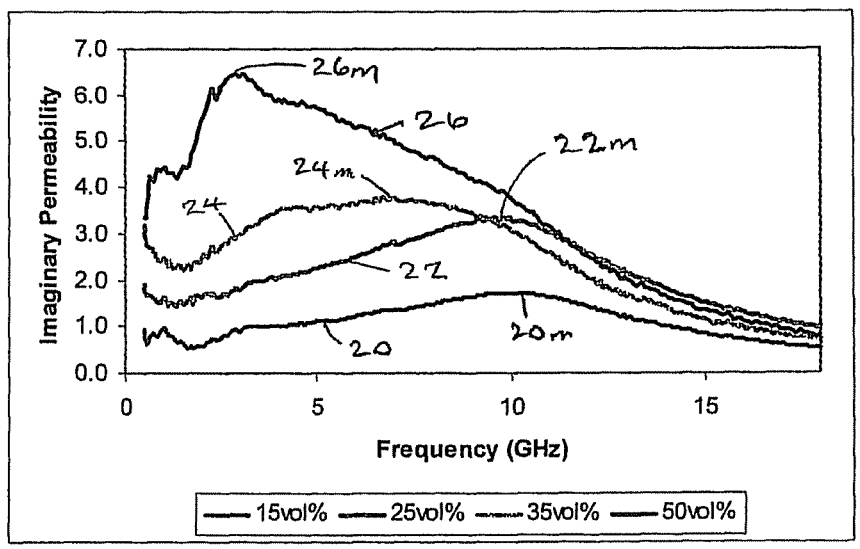

Imaginary components of permeability plotted against microwave frequency in the range 0.5 to 18 GHz are shown in FIG. 2 for the same four composite materials: in this drawing, curves 20, 22, 24 and 26 relate respectively to 15 vol %, 25 vol %, 35 vol % and 50 vol % magnetic flakes dispersed in paraffin wax. The curves 20 to 26 show respective maxima 20m to 26m, and the maxima move to lower frequencies and higher magnitudes as percentage magnetic flake loading increases.

Figure 3:
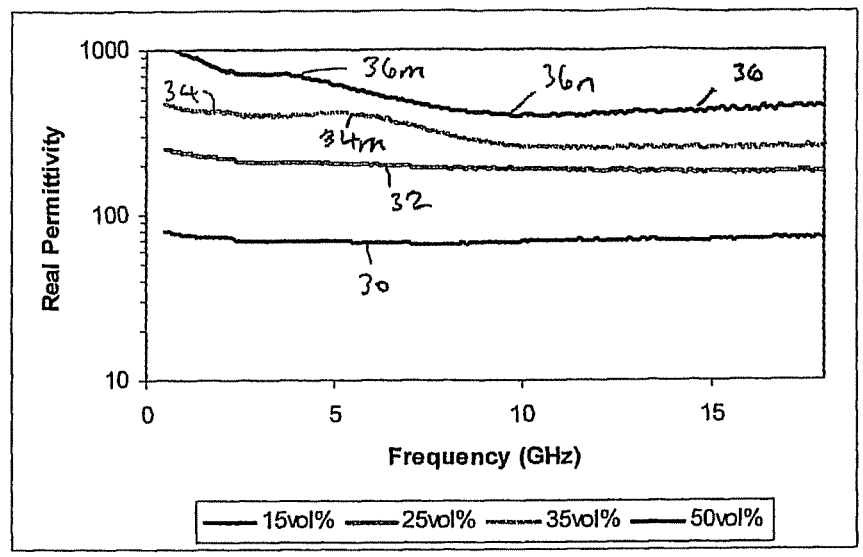
Figure 4:
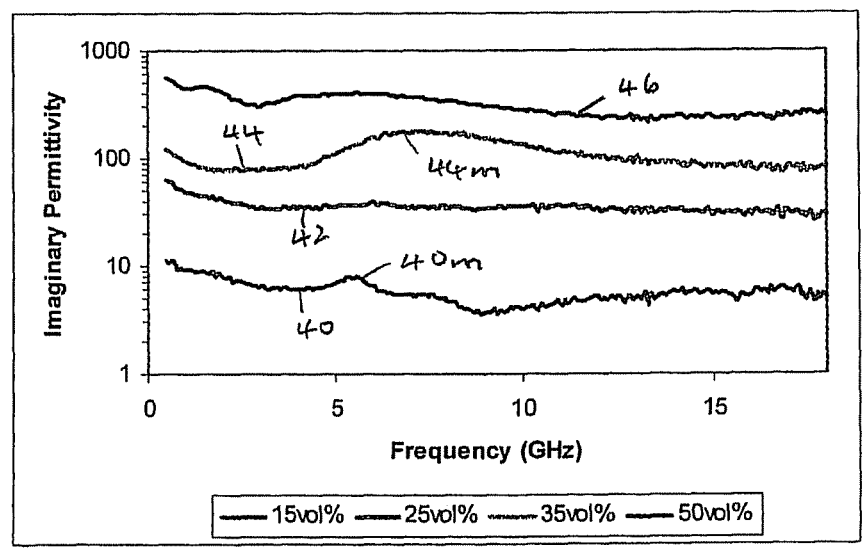

Real and imaginary components of permittivity plotted on a logarithmic scale against microwave frequency in the range 0.5 to 18 GHz are shown in FIGS. 3 and 4 respectively for the same four composite materials as before: in FIG. 3, curves 30, 32, 34 and 36 relate respectively to 15 vol %, 25 vol %, 35 vol % and 50 vol % magnetic flake loadings, as do curves 40, 42, 44 and 46 in FIG. 4.

FIG. 3 shows that the real component of permittivity is positive for all four materials and is not very sensitive to frequency, albeit curve 34 has a small maximum at 34m and curve 36 has a small maximum at 36m and a small minimum at 36n. The same remarks apply to curves 40, 42, 44 and 46 in FIG. 4, except that curves 40 and 44 have slightly more pronounced maxima at 40m and 44m.

As components of composite materials, the magnetic performance of flakes and other high aspect ratio particles differs significantly from that of conventional composite materials incorporating spherical particles. Unlike spheres, flakes are morphologically anisotropic, and consequently the magnetic properties of a composite material containing them depend on the orientation of the flake relative to the magnetic field. When a magnetic field is applied which is parallel to the flake's long axis (i.e. the flake diameter), greater coupling between the magnetic field and the flake is expected, which leads to an enhanced permeability when all of the flakes have their long axes aligned with one another. Alternatively, when the field is parallel to the flake short axis (i.e. the flake thickness), a reduced permeability is expected. Therefore, flakes aligned in a composite material each with its long axis parallel to the magnetic field would be expected to produce the best permeability: even approximate alignment (i.e. within 10 degrees of parallelism) of the long axes will produce enhanced permeability compared to that associated with long axes in random directions. The flakes may be aligned in liquid paraffin wax by applying a magnetic field and then solidifying the wax. Low viscosity resins could be used instead of paraffin wax, and the flakes could be dispersed in this resin, aligned by an applied magnetic field and the paint left to cure. Alternatively, the flakes could be dispersed into metal-like coatings, which produce aligned flakes on drying/curing. Modelling has shown that even a random mixture of flakes would produce an enhanced performance in comparison to spherical particles and therefore provides better candidate materials for negative permeability response.

The magnetic flakes produced relatively high permeability for low vol % loadings in the composite material in comparison to spherical iron particles likewise dispersed in paraffin wax (as will be described in more detail later). The flakes exhibit a stronger FMR response than spherical iron particles, which means that they overcome damping effects at higher loadings to produce negative permeability beyond a critical volume loading (25 vol %). FMR provides a mechanism by which negative permeability can potentially be achieved with magnetic granular materials. FIG. 1 shows no significant difference between the negative permeability reached for composite materials with 35 vol % and 50 vol % magnetic flake loadings, despite the fact that the overall magnitude of permeability is higher for a 50 vol % loading. The corresponding permittivity (FIGS. 3 and 4) is also higher for a 50 vol % loading, which indicates greater ferromagnetic resonance damping. This is also the reason for the apparent shift in ferromagnetic resonance frequency at magnetic flake higher loadings, the shift being determined by peak positions 20m to 26m of the imaginary permeability in FIG. 2.

In addition to obtaining negative permeability, it is desirable to be able to control permittivity at the same time and if possible to obtain negative permittivity simultaneously with negative permeability. The inventors demonstrated that 40 vol % graphite dispersed in paraffin wax produced negative permittivity. Control over permittivity combined with negative permeability was investigated using a two-filler particle mix of graphite mixed with carbonyl iron flakes (as used in earlier embodiments). Here again the host matrix or binder was paraffin wax.

Figure 5:
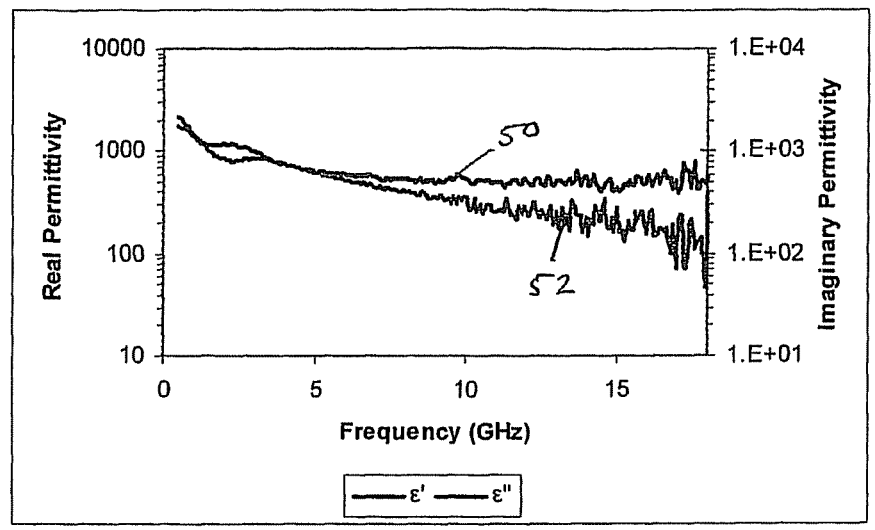
FIG. 5 shows graphs of real and imaginary components of permittivity against microwave frequency for a composite material comprising magnetic flakes and graphite dispersed in paraffin wax.
Figure 6:
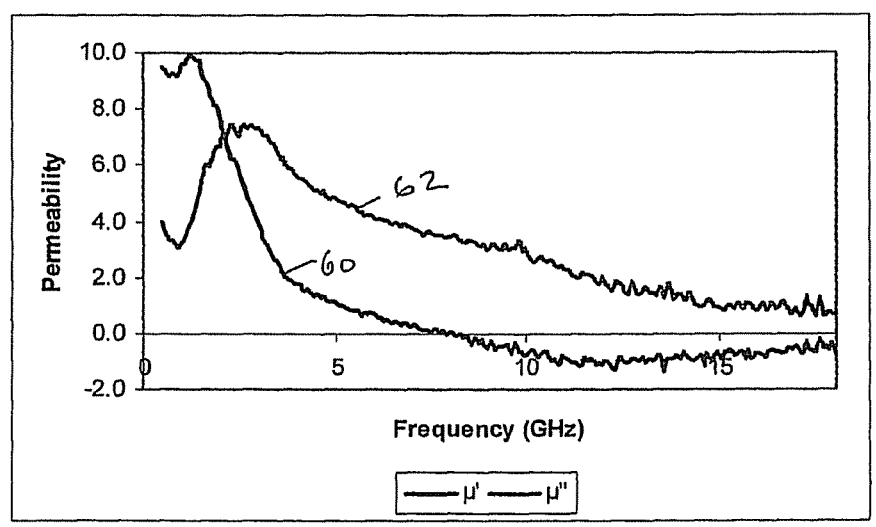
FIG. 6 provides graphs of real and imaginary components of permeability against microwave frequency for the composite material to which FIG. 5 relates.

Real and imaginary components of permittivity 50 and 52 plotted on right and left hand logarithmic scales respectively against microwave frequency in the range 0.5 to 18 GHz are shown in FIG. 5 for a composite material consisting of 40 vol % magnetic flakes, 20 vol % graphite, and 40 vol % paraffin wax: The magnetic flakes in the composite materials were carbonyl iron flakes with quoted average diameter of ~50 μm and thickness of ~1 μm as before. The graphite particles were quoted by their manufacturer to have an average diameter of ~2 μm Referring now also to FIG. 6, real and imaginary components of permeability 60 and 62 plotted on right and left hand scales respectively against microwave frequency in the range 0.5 to 18 GHz are shown for the composite material to which FIG. 5 relates. Curve 60 in FIG. 6 shows negative permeability has been obtained, in combination with an increase in permittivity compared to results shown in FIGS. 3 and 4. Although negative permittivity was not achieved, the results demonstrate that the permittivity and permeability can be controlled separately with a combination of two filler components, one magnetic component and the other an electrically conducting component: the right combination of fillers could potentially provide negative refractive index.

The inventors showed that a single filler 40 vol % graphite loading in 60 vol % paraffin wax (i.e. no magnetic particles) produced negative permittivity. Consequently, attempts were made to produce a composite material consisting of 40 vol % magnetic flakes, 40 vol % graphite, and 20 vol % paraffin wax in order to produce negative permittivity with negative permeability: however, the low proportion of paraffin wax of 20 vol % proved to be too low to produce suitable samples for electromagnetic characterisation.

There are also a number of other routes potentially capable of achieving simultaneous negative permittivity and negative permeability. Although the parameters for achieving negative permittivity have not been fully established, microstructure has been shown in published International Application No. WO 2005/052953 A1 to have a significant effect on composite material properties. For paraffin wax and magnetic flake mixes described above, the paraffin wax forms a continuous medium, as it is mixed in molten form before solidification. The host medium or matrix may be changed to particulate form (e.g. PTFE dry powder mix, average particle size 1 μm or 100 μm) to form a discrete matrix: this leads to a change in composite material microstructure and resulting dielectric properties. As the size ratio of filler particles to PTFE particles changed, the composite material's percolation threshold (see below) and resulting negative permittivity requirements changed. The permittivity was shown to produce negative values at lower loadings using PTFE instead of paraffin wax as the host matrix. Repeating the combinations demonstrated above with alternative matrices (e.g. particulate PTFE) may therefore produce negative permittivity and negative permeability simultaneously.

A composite material's percolation threshold is a critical percentage loading by conducting particles in an insulating host matrix at which a continuous conducting network is established and the material undergoes a transition from insulating to conducting.

It is also envisaged to use magnetic flakes with conductive coatings to provide conductivity and magnetic effects simultaneously: this avoids the need for two different fillers with relatively high loadings, which results in inadequate loading of the paraffin wax host matrix or binder. The higher particle conductivity provided by the conductive coating increases the probability of obtaining negative permittivity, while negative permeability should result from the magnetic flakes.

If the random composite method fails to produce granular materials with simultaneous negative permittivity and negative permeability, methods analogous to those already used for metamaterials could be explored. For example, stacked layers composed of alternating negative permittivity and negative permeability layers, to produce a combined NRI response. Such a material would produce an anisotropic structure, but it could be cut into pellets and the pellets randomly re-combined to produce a random composite.

Figure 7:
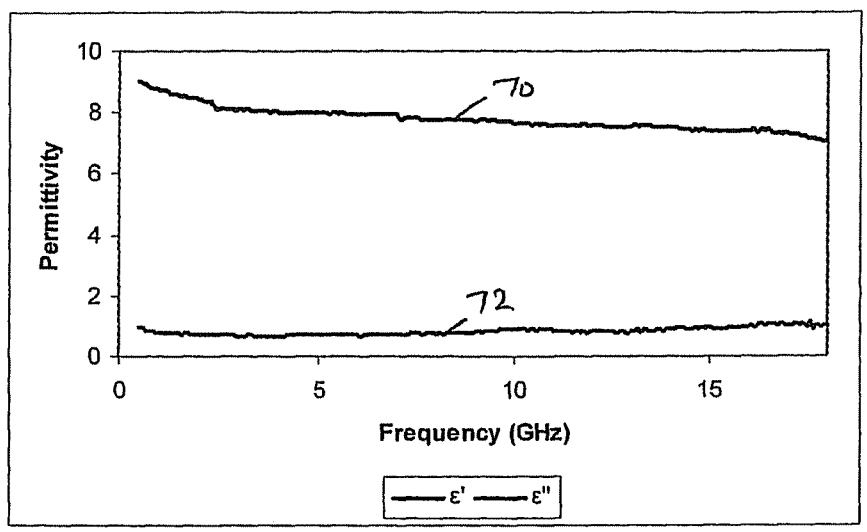
FIG. 7 shows comparison graphs of real and imaginary components of permittivity against microwave frequency for a composite material comprising spherical magnetic particles dispersed in paraffin wax.

For the purposes of comparison, a composite material was produced as described earlier but using nominally spherical magnetic particles (aspect ratio=1) instead of magnetic flakes (aspect ratio=50). The spherical magnetic particles were 1 μm diameter carbonyl iron particles, and these were dispersed at 25 vol % in paraffin wax as before. Real and imaginary components of permittivity for this material plotted against microwave frequency in the range 0.5 to 18 GHz are shown in FIG. 7 as curves 70 and 72 respectively. Comparing curves 70 and 32 (FIG. 3), both for 25 vol % magnetic particle loading, it can be seen that the change to spherical magnetic particles reduced the real component of permittivity from 200 to 8; similarly, from curves 72 and 42 (FIG. 4), both for 25 vol % magnetic particle loading, the change to spherical magnetic particles reduced the imaginary component of permittivity from 40 to less than 1 (values approximate in both comparisons).

Figure 8:
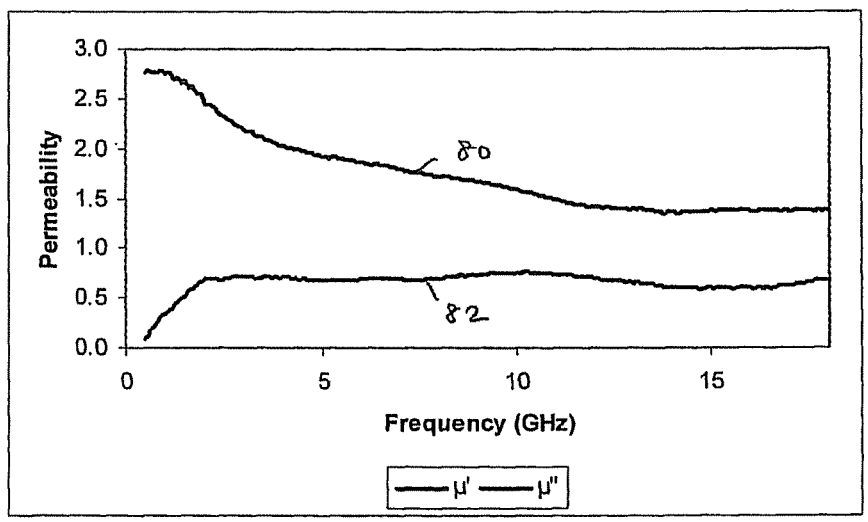
FIG. 8 provides comparison graphs of real and imaginary components of permeability against microwave frequency for the composite material to which FIG. 7 relates.

Measurements of permeability were also made upon this spherical magnetic particle material. Real and imaginary components of permeability for this material plotted against microwave frequency in the range 0.5 to 18 GHz are shown in FIG. 8 as curves 80 and 82 respectively. Comparing curves 80 and 12 (FIG. 1) both for 25 vol % magnetic particle loading, the change to spherical magnetic particles involves the loss of a negative real component of permeability; similarly, from curves 82 and 22 (FIG. 2), both for 25 vol % magnetic particle loading, the change to spherical magnetic particles reduced the imaginary component of permeability from the range 2-3.4 to less than 1 (values approximate in both comparisons).

From curve 80, the real component of permeability, $\mu'$, for the spherical magnetic particle material is greater than 1, which is typical of composites containing micron dimension magnetic particles: it results from ferromagnetic ordering in the magnetic particles. The FMR response is also damped by eddy currents in the magnetic particles. Eddy currents are induced in sufficiently conductive materials (i.e. high conductive filler loadings) to which an electromagnetic field is applied: it results in opposing magnetic fields and therefore impedes the magnetic performance.

A composite material was also produced with an increased 60 vol % loading of spherical magnetic particles in paraffin wax: this material exhibited greater conductivity and eddy current effects, and a real component of permeability which approached zero. However, eddy current effects cannot be used to achieve negative permeability, because the lowest value of the real component of permeability achievable from these effects is 0 (obtained when eddy currents entirely screen magnetic particles from an applied field). This material also exhibited an apparent reduction in the ferromagnetic resonance frequency compared to the material with 25 vol % to which FIGS. 7 and 8 relate: a probable explanation for this is that the higher frequency region of the ferromagnetic resonance is damped due to eddy current effects.

A negative permeability composite material of the invention may be used to pervade the pores or voids of an electrically conducting foam such as a metal foam or a metal alloy foam: such a foam/composite combination is a potential candidate for a negative refractive index material. The reasons for this are as follows. A metal foam is a self supporting cellular structure consisting of a metal host medium with either sealed voids (closed-cell), or an interconnected network of voids (open-cell). There can be considerable variation in foams' pore sizes, densities and volume fractions of void to metal. Metal foams are percolated materials with an excluded volume microstructure which is electrically conducting, as disclosed for example in published International Application No. WO/2005/052953: i.e. metal is excluded from void regions, in an analogous manner to that in composite materials with electrically conducting material of relatively small particle size dispersed in electrically insulating material of relatively large particle size. Consequently a metal foam of appropriate geometry, pore size to wavelength ratio and composition may exhibit negative permittivity.

An open cell metal foam having an excluded volume microstructure with pores or voids pervaded by a negative permeability composite material may therefore exhibit both negative permittivity and negative permeability, as required to provide negative refractive index.

The invention claimed is:

1. A composite material comprising magnetic particles dispersed in electrically insulating material, wherein the magnetic particles are magnetic flakes of reduced carbonyl iron having an aspect ratio greater than 10 and are present in the composite material with a concentration sufficient to produce negative permeability at ferromagnetic resonance.

2. A composite material according to claim 1 wherein the magnetic flakes have an average longest dimension of 50 μm and an average thickness of 1 μm.

3. A composite material according to claim 1 wherein the magnetic particles are present in the composite material with a concentration exceeding 25% by volume.

4. A composite material according to claim 1 wherein the electrically insulating material is paraffin wax, particulate PTFE or another polymer.

5. A composite material according to claim 1 wherein the magnetic particles have respective longest dimensions which are sufficiently well aligned with one another to produce enhanced permeability for a like aligned magnetic field.

6. A composite material comprising magnetic particles dispersed in electrically insulating material, wherein the magnetic particles have an aspect ratio greater than 1 and are present in the composite material with a concentration sufficient to produce negative permeability at ferromagnetic resonance, the composite material including an electrically conducting component to provide control over permittivity wherein the electrically conducting component comprises conductive coatings upon the magnetic particles.

7. A composite material according to claim 6 wherein the electrically conducting component is graphite.

* * * * *